(12) United States Patent
Pavlic et al.

(10) Patent No.: US 8,495,696 B1
(45) Date of Patent: Jul. 23, 2013

(54) COAXIAL COMMUNICATION ACTIVE TAP DEVICE AND DISTRIBUTION SYSTEM

(75) Inventors: John Pavlic, Port Matilda, PA (US); Mark Fox, Ramey, PA (US); Victor Scott Shupe, Murfreesboro, TN (US)

(73) Assignee: ARRIS Solutions, Inc., Suwanee, GA (US)

( * ) Notice: Subject to any disclaimer, the term of this patent is extended or adjusted under 35 U.S.C. 154(b) by 718 days.

(21) Appl. No.: 12/768,579

(22) Filed: Apr. 27, 2010

Related U.S. Application Data

(63) Continuation of application No. 10/805,226, filed on Mar. 22, 2004, now Pat. No. 7,721,317.

(51) Int. Cl.
*H04N 7/173* (2011.01)
*H04N 7/16* (2011.01)

(52) U.S. Cl.
USPC .......................................... 725/127; 725/149

(58) Field of Classification Search
None
See application file for complete search history.

(56) References Cited

U.S. PATENT DOCUMENTS

| | | | | |
|---|---|---|---|---|
| 3,983,486 | A * | 9/1976 | Rheinfelder | 725/149 |
| 4,475,242 | A * | 10/1984 | Rafal et al. | 725/73 |
| 4,963,966 | A * | 10/1990 | Harney et al. | 725/149 |
| 5,058,198 | A * | 10/1991 | Rocci et al. | 725/149 |
| 5,539,657 | A * | 7/1996 | Utsumi et al. | 725/75 |
| 5,724,344 | A * | 3/1998 | Beck | 370/295 |
| 5,729,824 | A * | 3/1998 | O'Neill et al. | 725/106 |
| 5,745,159 | A * | 4/1998 | Wax et al. | 725/76 |
| 5,870,513 | A * | 2/1999 | Williams | 385/24 |
| 5,999,796 | A * | 12/1999 | Tresness et al. | 725/125 |
| 6,033,101 | A * | 3/2000 | Reddick et al. | 700/286 |
| 6,393,607 | B1 * | 5/2002 | Hughes et al. | 725/130 |
| 6,483,629 | B1 * | 11/2002 | Boffi et al. | 359/336 |
| 6,694,517 | B1 * | 2/2004 | James et al. | 725/127 |
| 6,785,908 | B1 * | 8/2004 | Kamiya | 725/149 |
| 6,804,099 | B2 * | 10/2004 | Michon et al. | 361/91.1 |
| 6,941,576 | B2 * | 9/2005 | Amit | 725/143 |
| 7,039,942 | B2 * | 5/2006 | Dan et al. | 725/127 |
| 7,086,078 | B1 * | 8/2006 | Gresko et al. | 725/127 |
| 7,127,734 | B1 * | 10/2006 | Amit | 725/80 |
| 7,138,886 | B2 * | 11/2006 | Strull et al. | 333/109 |
| 2002/0138854 | A1* | 9/2002 | Desai et al. | 725/147 |
| 2003/0014766 | A1* | 1/2003 | Dinwiddie et al. | 725/126 |
| 2004/0213532 | A1* | 10/2004 | Wyatt et al. | 385/123 |
| 2005/0034167 | A1* | 2/2005 | Weinstein et al. | 725/129 |

* cited by examiner

*Primary Examiner* — Brian Pendleton
*Assistant Examiner* — Ryan Stronczer
(74) *Attorney, Agent, or Firm* — Troy A. Van Aacken; Robert J. Starr

(57) ABSTRACT

An apparatus, system, and method for affordably distributing cable communication signals at greatly reduced power consumption levels with high signal quality with an active tap having gain stage characterized by low power (less than 1 Watt), low noise figure (less than 3 dB), high bandwidth (typically DC-2 GHz), and high gain (at least 15 dBmV).

36 Claims, 9 Drawing Sheets

COAXIAL COMMUNICATION ACTIVE TAP DEVICE AND DISTRIBUTION SYSTEM

CROSS REFERENCE TO RELATED APPLICATION

This application is a continuation of, and claims priority to, U.S. patent application Ser. No. 10/805,226, entitled, "Coaxial Communication Active Tap Device and Distribution System," filed Mar. 22, 2004, which is hereby incorporated by reference in its entirety.

BACKGROUND OF THE INVENTION

1. Field of Invention

A low-cost active tap for use in cable communication distribution systems and characterized by low power consumption, low signal distortion, and increased reliability.

2. Summary of the Background

In conventional coaxial communication distribution systems, signals are distributed along cable lines. Consumers located along the length of the cable run are supplied with signals via passive taps. FIG. 1 is a block diagram of a conventional four-port 24 dB passive tap device. The input signal flows in parallel to a power-passing choke PPC1 and to a series circuit comprising a first capacitor C1, a directional coupler DC, and a second capacitor C2. The directional coupler DC also outputs signals to a first splitter S1. This first splitter S1 feeds the signal then to a pair of second splitters S2A and S2B. The output of the second splitters S2A and S2B then flows to output ports O1, O2, O3, and O4. Signals may also flow upstream from output ports O1, O2, O3, and O4, through splitters S2A, S2B and S1 and directional coupler DC to a node upstream from the tap.

Because the components of the conventional tap are passive, the conventional tap attenuates the signal between its through-leg input and output as well as between its input and output to the subscribers. Thus, signal strength at the output of the device (e.g., 40.5 dBmV) is lower than at the input (e.g., 42.5 dBmV). The signal level at the output terminal of the directional coupler DC feeding S1 is predetermined by the design of the directional coupler. That is, a conventional DC16-type directional coupler provides a signal approximately 16 dB lower than the input signal level (i.e., 26 dBmV).

In order to maintain consumer cable TV and other communication signal quality, components of the conventional passive tap device are typically selected depending on the tap input signal level so that the signal level at each of output ports O1, O2, O3, and O4 is a minimum of 18 dBmV at the uppermost frequency. For example, as shown in FIG. 1, if the conventional passive tap device has an input of 42 dBmV, the directional coupler (DC-16) is selected to provide 26 dBmV at the input to splitter S1. This supplies 22 dBmV to S2A and S2B, which in turn supplies 18 dBmV to O1, O2, O3 and O4. This configuration also results in an output of the conventional tap device of 40.5 dBmV. As the signal level into the device decreases, the value of the DC also decreases and the through loss of the device increases.

FIG. 2 shows an idealized model of a conventional system for distributing signal from a source I1 to a number of consumers. Components of the conventional system include a source I1 in series with conventional passive taps P1-P18 and active line extenders LE1, LE2, and LE3. The passive taps P1-P18 each correspond to the device of FIG. 1, with the exception that the proper DC was selected to provide a minimum subscriber output of +18 dBmV. With this configuration, 18 passive taps with 4 output ports allow for 72 consumers to be supplied by source I1.

In FIG. 2 the figures of merit are composite triple beat (CTB); composite second order beat (CSO); and carrier-to-noise ratio (CNR). In FIG. 2, source I1 outputs a signal according the following profile: 54 dBmV at 862 MHz, 48 dBmV at 550 MHz, and 39 dBmV at 55 MHz. In addition, the signal output from source I1 has a CTB of −64.0 dB; a CSO of −60.0 dB; and a CNR of 51.0 dB. The signal propagates through the first five passive taps P1-P5 and coax during which the signals are attenuated to a level where no more subscribers can be supplied with +18 dBmV. So the signals must be amplified. The signals from the output of P5 are presented at the input to extender LE1. Line extender LE1 is configured to boost the signal to 49.5 dBmV at 862 MHz, 44 dBmV at 550 MHz, and 35 dBmV at 55 MHz. The signal passes through the next four passive taps to line extender LE2. Line extender LE2 is also configured to boost an input signal to 49.5 dBmV at 862 MHz, 44 dBmV at 550 MHz, and 35 dBmV at 55 MHz. The signal passes through the next four passive taps to line extender LE3. Line extender LE3 is also configured to boost an input signal to 49.5 dBmV at 862 MHz, 44 dBmV at 550 MHz, and 35 dBmV at 55 MHz. The signal then passes through the final five passive taps. For the reasons noted relative to FIG. 1, the system is designed so that the signal level at output ports O1, O2, O3, and O4 of each passive tap is on the order of 18 dBmV.

Throughout the propagation of the signal through the system, signal loss is introduced by the cable and passive taps. Line extenders are used to overcome the system losses but cause distortion to be added to the signals. Thus, at the output of line extender LE1, CTB equals −60.5 dB; CSO equals −59.0 dB; and CNR equals 50.4 dB. At the output of line extender LE2, CTB equals −58.0 dB; CSO equals −58.2 dB; and CNR equals 49.8 dB. At line extender LE3, CTB equals −56.0 dB; CSO equals 57.5 dB; and CNR equals 49.3 dB. Since all the devices after each LE are passive, the distortion numbers are the same for all taps after each LE, until the next LE. For example, the last 5 taps all have a CTB of −56.0 dB. The previous 4 taps have a CTB of −58.0 dB. CTB adds on a 20 log basis with the sum of the distortion of the source output plus the distortion generated by each LE. CSO and CNR add on a 10 log basis.

FIG. 3 illustrates signal characteristics for a more realistic cable television signal distribution system developed with conventional system modeling software. In FIG. 3, source N1 outputs a signal onto a first cable C1 of length 271 feet. The signal drops in strength due to line losses and is split by splitter S1 onto cables C2, C3, and C6. Cable C2 ends after 59 feet at a DC10 passive tap P1. Cable C3 extends 84 feet to a DC12 passive tap P2 which is connected to DC12 passive tap P3 via 230 feet of cable $C4_2$. Passive tap P3 is connected to a terminating passive tap P4. Cable C6 extends 538 feet to line extender LE1 which connects to a DC16 passive tap P5 via an additional 268 feet of cable C7 (the total length of cables C6 and C7 is 806 feet). Passive tap P5 connects to a DC8 directional coupler DC1 which is connected to a DC14 passive tap P6 (on the down-leg) and to cable C8, which extends 259 feet to a DC12 passive tap P7. Passive tap P7 connects to cable C9 which extends 277 feet to in-line equalizer EQ1, which is connected to a DC4 passive tap P8.

Input and output signal levels (in terms of dBmV) at 862 MHz/750 MHz/55 MHz, respectively, are shown in Table T1

TABLE T1

| Device | Input Signal Level | Output Signal Level |
|---|---|---|
| N1 | --/--/-- | 50/48/36.5 |
| C1 | 50/48/36.5 | 46.5/44.7/35.6 |
| S1 | 46.5/44.7/35.6 | 41.8/40.2/32.1 |
|  |  | 38.1/36.7/28.6 |
| C2 | 38.1/36.7/28.6 | 37.3/35.6/28.4 |
| P1 | 37.3/35.6/28.4 | 20/19/11 |
| C3 | 41.8/40.2/32.1 | 40.7/39/31.8 |
| P2 | 40.7/39/31.8 | 20/18/11 |
| $C4_2$ | 38.9/37.2/31.1 | 35.9/34.9/30.3 |
| P3 | 35.9/34.9/30.3 | 20/18/14 |
| $C5_2$ | 34.1/32.8/29.7 | 25.5/24.8/27.5 |
| EQ2 | 25.5/24.8/27.5 | 25.1/23.9/17.5 |
| P4 | 25.1/23.9/17.5 | 17/15/12 |
| C6 | 38.1/36.7/28.6 | 28.6/27.8/26.4 |
| LE1 | 28.6/27.8/26.4 | 50/48/36.5 |
| C7 | 50/48/36.5 | 46.5/44.7/35.6 |
| P5 | 46.5/44.7/35.6 | 23/21/12 |
| DC1 | 45.4/43.7/35.3 | Through: 43.6/42.1/34.6 |
|  |  | Down-Leg: 37.4/35.7/27.3 |
| P6 | 37.4/35.7/27.3 | 20/19/12 |
| C8 | 43.6/42.1/34.6 | 40.3/39.2/33.7 |
| P7 | 40.3/39.2/33.7 | 20/19/14 |
| C9 | 38.5/37.1/33.1 | 34.9/34.4/32 |
| EQ1 | 34.9/34.4/32 | 34.5/33.0/22.4 |
| P8 | 34.5/33.0/22.4 | 17/16/11 |

FIG. 4 illustrates the power consumption of the idealized system of FIG. 2. As shown in FIG. 4, power consumption of active line extenders LE1, LE2 and LE3 is 28.5 watts each, resulting in a total power consumption of 85.5 watts. Based on a power supply located at the Source I1, and a 0.500" PIII DC loop resistance of 1.2 Ohms/1000 ft, the power dissipated by the cable is 1.95 Watts. Power consumption of the conventional taps is minimal because the only component that would dissipate any power in the tap is the RF Choke (PPC1 in FIG. 1). The resistance of the RF Choke, which allows the power to pass through the tap, is typically less than 0.01 Ohms. Thus total power consumed in the idealized conventional system shown in FIG. 4A is 87.15 watts (85.5+1.95 watts). Cable TV (CATV) operators are extremely interested in reducing power consumption in their distribution systems. Even a savings of 3 watts, which can save $15 in power costs over 5 years, is considered very favorably.

In 1991, Chiddix and Vaughn proposed a concept of an active tap. This proposal was motivated by the difficulties at the time of increasing cable services by just increasing the bandwidth of the distribution plant. The intent of the paper was to encourage manufacturers to help solve these problems by building an active tap that would extend services to a larger number of customers without undue signal distortion. (In 1991, no CATV distribution equipment was being built with GaAs active devices or bipolar transistors with an $f_T$ of 6 GHz. Gain stages at the time that were rated above 550 MHz provided additional bandwidth, but had poor distortion performance.) A small segment of a cable system owned by Chiddix's employer was built with a bandwidth of 1 GHz to test pay-per-view markets. The system was built in the traditional way (amplifiers and passive taps). The experiment was a marketing success, but the amplifier distortion performance was insufficient, thus making the system impractical.

For many reasons, the active tap proposed by Chiddix and Vaughn were not reduced to practice. First, to achieve suitable performance the equipment power requirements would have increased and the power passing circuitry did not exist. At the time, it was not possible to make power-passing circuitry capable of passing in excess of 15 amps without saturating the ferrite coil form, causing modulation of the RF signals. Second, the power consumption of the active tap concept of Chiddix and Vaughn, if ever reduced to practice, would have resulted in a system that was not cost-effective to operate. For example, if, as described, a gain stage were used at each subscriber port, a 4-port tap would consume in excess of 32 watts (whereas the device disclosed in the following detailed description will provide the same functionality while requiring only 0.5 watts, providing a $150 savings in powering over five years for every active tap).

Third, system managers are graded on subscriber minute outages. A 1991 cable system could have 100,000 or more subscribers. The signals for these subscribers would all originate from the head-end and begin by flowing through a single amp. If that amp fails, the network suffers 100,000 subscriber minute outages for every minute the system is down. The Chiddix-Vaughn proposal did not reduce the problems associated with amplifier cascades, but added to the system downtime probability by increasing the number of system power supplies required. Power outages at supply locations are a major source of system outages.

Fourth, no cable systems have ever been built with 550 MHz, or 1 GHz bandwidth, as suggested by Chiddix and Vaughn. No device was available then or is available even today, that could operate at 55 dBmV output with 151 analog channels. Furthermore, Chiddix and Vaughn's proposal to power the active tap from one of possible four subscriber's houses adds cost, complexity and unreliability to the system. Also, if the subscriber providing power disconnects, a major reconfiguration of the system will be needed.

Fifth, a concern of an active or passive tap system is reverse signal levels. Devices installed in houses have a maximum output of +55 dBmV. The described reverse injection of 30 to 40 dB in the system of Chiddix and Vaughn would not provide enough signal to drive the reverse laser circuitry at the fiber node. In real applications the directional coupler is selected to satisfy the reverse signal requirements.

Sixth, the system of Chiddix and Vaughn is lacks control of signal level change due to system ambient temperature changes. The lack of amplitude control and cable versus frequency equalization cause the reach of the system to be reduced and could cause unacceptable signal to distortion levels at the subscriber ports.

Finally, to be cost-effective the system proposed by Chiddix and Vaughn required the unit to have a selling price of $100. The cost to build the unit was estimated to be in excess of $120. Manufacturing cost of an off-premise converter which contained some of the components required, such as microprocessors, hybrids, PIN diode switches, DC power supply, was $235 per subscriber. Because manufacturing costs were estimated to be more than double what was required to be cost-effective, no devices were ever built.

Because the technology of the day did exist to build the device suggested by Chiddix and Vaughn, because the overall system was economically and operationally inoperative, and because since 1991 the utilization of fiber optics has increased and digital compression of TV channels have provided a great deal of additional service capacity to the systems, and improvement in traditional gain stages, including GaAs active devices has provided a means of building systems with a bandwidth of 870 MHz, the proposal of Chiddix and Vaughn was not reduced to practice.

Thus, what is desired, as discovered by the present inventors, is a capability for distributing coaxial communication signals at greatly reduced power consumption, and system reliability, where signal levels and quality are equal to or better than is possible with conventional amplifier and passive tap systems and where the amplification is provided at the tap and characterized by low power (less than 1 Watt), low noise figure (less than 3 dB), high bandwidth (typically 20-1.5 GHz), and high gain (e.g., input to subscriber output port gain of as much as 22 dB).

SUMMARY OF THE INVENTION

The present invention is directed to a low-cost active tap for use in coaxial cable communication distribution systems and characterized by low system power consumption and low signal distortion, as well as providing a technically feasible way to increase system bandwidth beyond 860 MHz.

The active tap includes a parallel circuit comprising a first power passing choke connected to a second power passing choke. In parallel to the two power passing chokes is a circuit comprising a first capacitor, a directional coupler and second capacitor. A power pick-off tap is placed between the first and second power passing chokes. 60 Hz power is passed from the power pick-off tap to the device's DC power supply. The output of the DC power supply is then fed to an amplifier, which provides gain for the device. The output of the directional coupler is fed to the combined terminal of a first diplex filter. The output of the high pass section of the first diplex filter is fed to the amplifier via a first attenuator. The output of the amplifier is then fed to a second high pass portion of a second complimentary diplex filter. The output of the combined port of the second complimentary diplex filter is then fed to a signal splitter, the split signal coming out of splitter is then fed to a pair of signal splitters. The output of the second pair of splitters and are then fed to four output ports.

While the active tap consumes power, these devices can be used to judicially replace conventional passive taps within a signal distribution network to obviate the need for expensive and power hungry traditional CATV repeater amplifiers, with the net result of lower overall power consumption and/or a much larger distribution network being supplied by a single power source. In general, factors for determining the number of passive and active taps that can be cascaded include: A) desired signal level at a node output; B) distance between taps; C) density of subscribers; D) size of coaxial cable; and E) efficiency of the directional coupler used in the network (e.g., DC-8, DC-12, DC-16).

Not only do these devices reduce the power required to run the system, they are also producible at much lower costs than conventional CATV repeater amplifiers (for example, line extenders, trunking amplifiers and bridging amplifiers). Active taps according to the present invention may eliminate most bridging amplifiers, trunking amplifiers and line extenders from coaxial communication networks.

DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
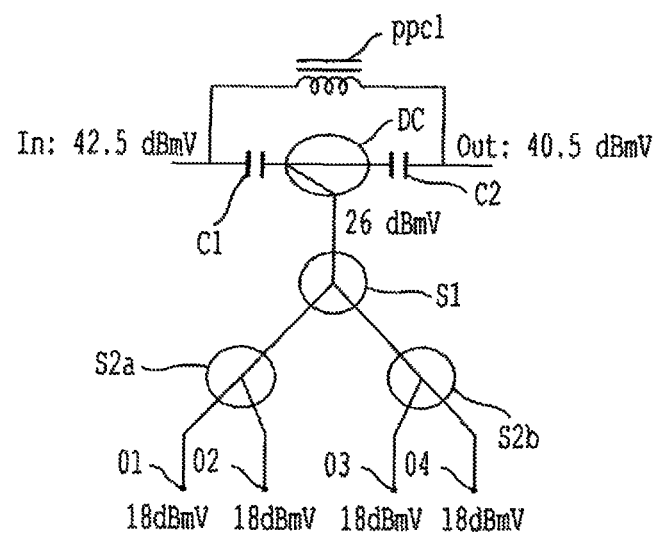
FIG. 1 is a schematic of a conventional passive tap.
Figure 5:
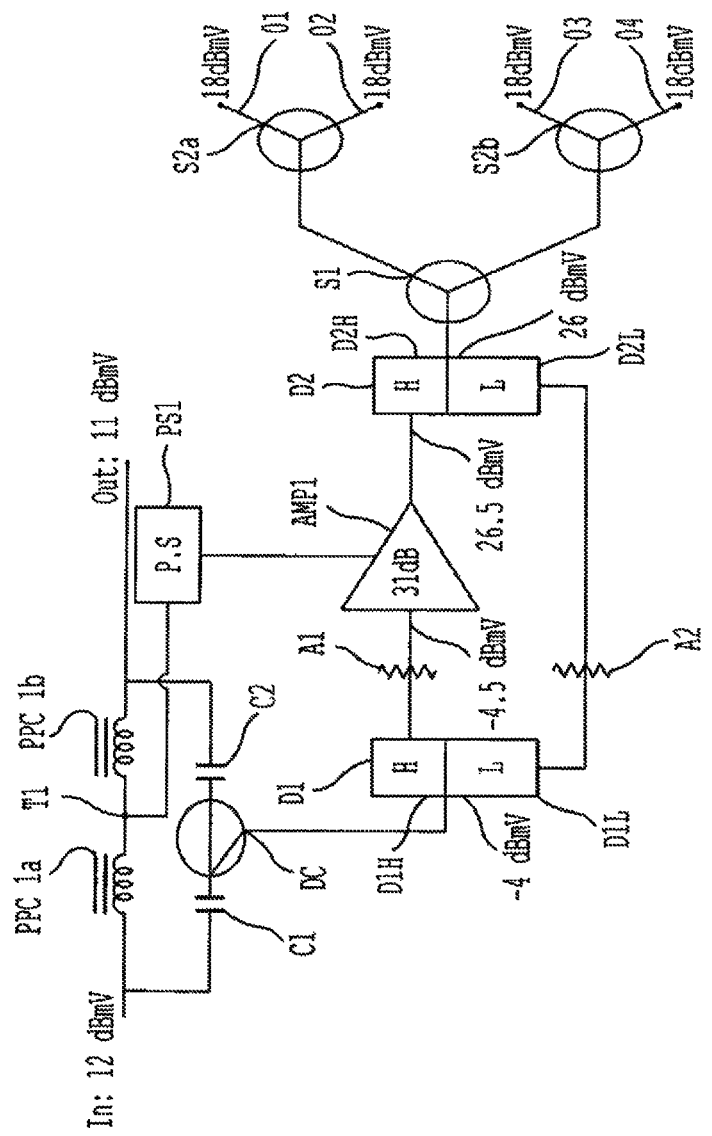
FIG. 5 is a schematic of an active tap according to one embodiment of the present invention.

FIG. 5 shows a block diagram of an embodiment of the present invention which corresponds in function but not in operation with the conventional passive tap block diagram of FIG. 1. Here an input value of 12 dBmV is presented to a parallel circuit comprising a first power passing choke PPC1A connected to a second power passing choke PPC1B. An output tap T1 is placed between the first and second power passing chokes (PPC1A and PPC1B). Signal is passed from the output tap T1 to a power supply PS1. The output of the power supply PS1 is then fed to an amplifier AMP1. In parallel to the two power passing chokes (PPC1A and PPC1B) is a circuit, comprising: a first capacitor C1, a directional coupler DC, and second capacitor C2. The output of the directional coupler DC is fed to the combined port of a first diplex filter D1. The output of the first high-pass filter D1H is fed to the amplifier AMP1 via a first attenuator A1.

The output of the amplifier is then fed to a second high pass portion D2H of a second diplex filter D2, complimentary to the first diplex filter D1. The output of the combined terminal of the second high-pass filter is then fed to signal splitter S1, the split signal coming out of splitter S1 is then fed to a pair of signal splitters S2A and S2B. The output of the second pair of splitters S2A and S2B are then fed to output ports O1, O2, O3, and O4.

Also shown in FIG. 5 is a feedback from the consumer through output ports O1 through O4 to one of a corresponding second signal splitter/combiner S2A or S2B to signal splitter/combiner S1 back then through the combined terminal of the second complimentary diplex filter through the low-pass section of D2L and D1L. In between the first and second low-pass filters is an optional attenuator A2 which is used to optimize signal levels in the reverse system. The output of the combined terminal of the first low-pass filter D1L is then fed back to the device input via the directional coupler DC.

In the passive tap shown in FIG. 1, signals from the subscriber units pass backwards through the output ports second splitters/combiners S2A and S2B, first splitter/combiner S1 and directional coupler DC to the input. In the active tap shown in FIG. 5, signals from the downstream consumer are passed through a respective output port O1 through O4, second splitters/combiners S2A, S2B, first splitter/combiner S1 through the low-pass portions (D2L and D1L of diplex filters D1 and D2. An optional attenuator A2 is included in between the first and second low-pass filters D2L and D1L so as to optimize reverse operating levels. The signal flowing back and out through the low-pass filter D1L is then fed to the input source through the directional coupler DC. In the passive tap system of FIG. 1, there is no need for a diplex filter because there is no gain stage in a passive tap. When there is no gain stage it is possible to run a reverse signal in the manner similar to the forward signal.

In one embodiment, the gain stage of the active tap of FIG. 5 has the following characteristics:

| | |
|---|---|
| DC power requirements: | 0.5 Watts Max. |
| Noise figure: | 3 dB Max. |
| Bandwidth: | Enough to meet current cable system requirements (typically 20-860 MHz minimum) |
| Gain: | Enough gain to provide 18 dBmV output at spigot when −4 dBmV is provided at an input by overcoming cable and internal losses such as splitters, diplex filters, etc. |
| RF output capability: | 20 dBm min. (P1 dB) |
| Input and Output impedance: | 50/75 Ohm |

In order to meet these gain-stage requirements, one embodiment of the present invention is developed with monolithic microwave integrated circuit (MMIC) technology. The MMIC gain stage of the present invention is characterized by high bandwidth (e.g., DC-2200 MHz), low noise figure (e.g., 3 dB), and low power requirements (e.g., 0.5 W max). One example device that may be used for the gain stage of the present invention is the AP 112 by RFHIC. While MMIC devices are used to overcome limitations presented by conventional circuit devices regarding bandwidth, noise figure, and power consumption, other technologies characterized by high bandwidth, low noise figure, and low power consumption may be used.

In one configuration, the amplifier is configured to provide 31 dB of gain. In this configuration, an active tap input of 12 dBmV results in output of 11 dBmV. As in FIG. 1, the signal level at the directional coupler DC is 16 dB lower than the input, thus equal to −4 dBmV at the input of D1H. After passing through the first high-pass filter D1H and attenuator A1 the value is further reduced to −4.5 dBmV. After passing through the amplifier the value is boosted from −4.5 dBmV to 26.5 dBmV. The signal level was reduced upon passing through the second high-pass filter D2H to a value of 26 dBmV thus, the input to splitter S1 is equal to the signal level input to splitter S1 in FIG. 1. However, contrary to the device of FIG. 1 where the input signal level is 42 dBmV, the input signal level of the active tap of FIG. 5 is only 12 dBmV. In this configuration, the active tap of FIG. 5 is estimated to have a power usage of 0.75 watts, based upon a MMIC drawing about 90 mA at 6 VDC. That is, calculating the DC wattage and then assuming an 80% efficient power supply results in an AC power consumption of 0.75 watts.

Figure 2:
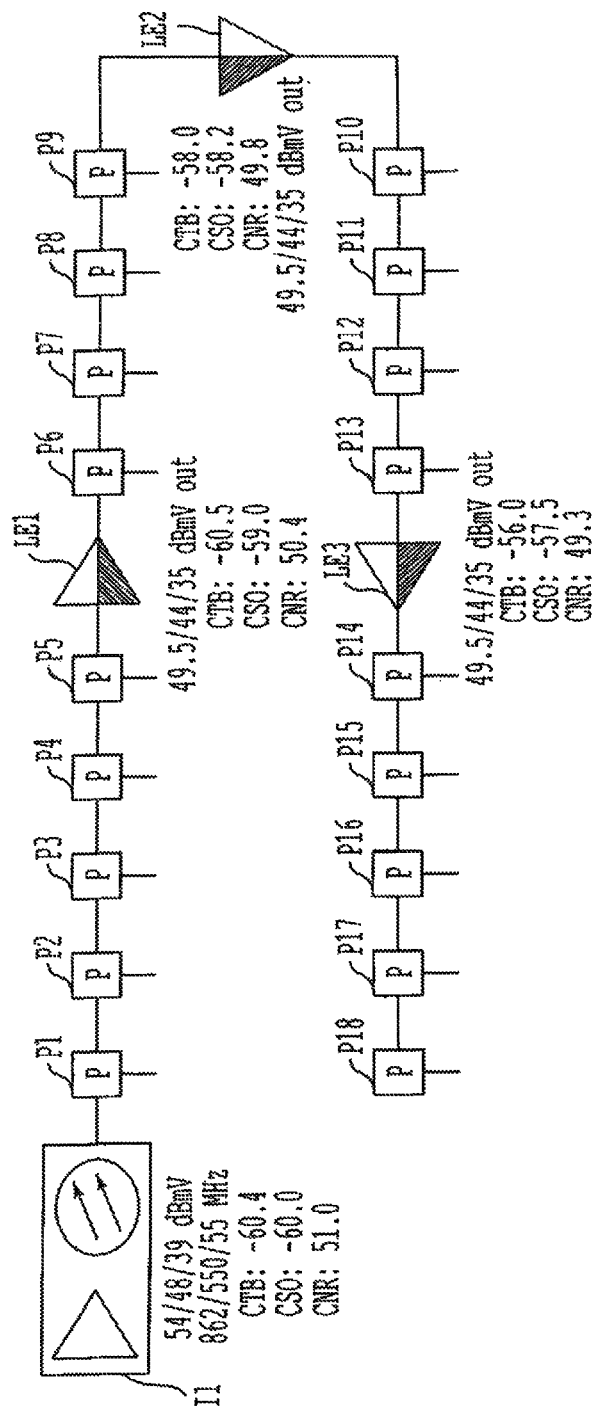
FIG. 2 is a block diagram of an idealized signal distribution system including the conventional passive tap of FIG. 1 where the figures of merit are signal quality.

In FIG. 5, directional coupler DC is a DC16 directional coupler (i.e., 1 dB insertion loss and 16 dB loss from the coupler input to the coupled port). However, other values of directional couplers (DC12, DC8, etc. are also possible. Also shown in FIGS. 1 and 2 are four output ports O1 through O4. However, in other configurations, other numbers of output ports may be arranged. Also, in another embodiment, the active device of FIG. 5 includes a terminus connected to the output of the second power passing choke. This embodiment is used at the end of a distribution line, for example, when the output signal is known to fall below a threshold for adequate amplification.

Figure 4:
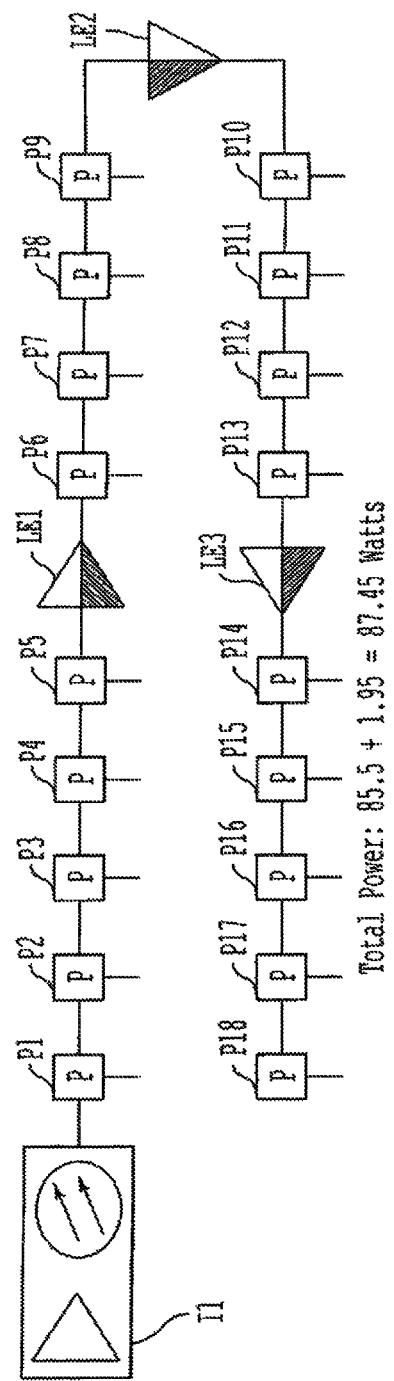
FIG. 4 is a block diagram of an idealized signal distribution system including the conventional passive tap of FIG. 1 where the figure of merit is power consumption.
Figure 6:
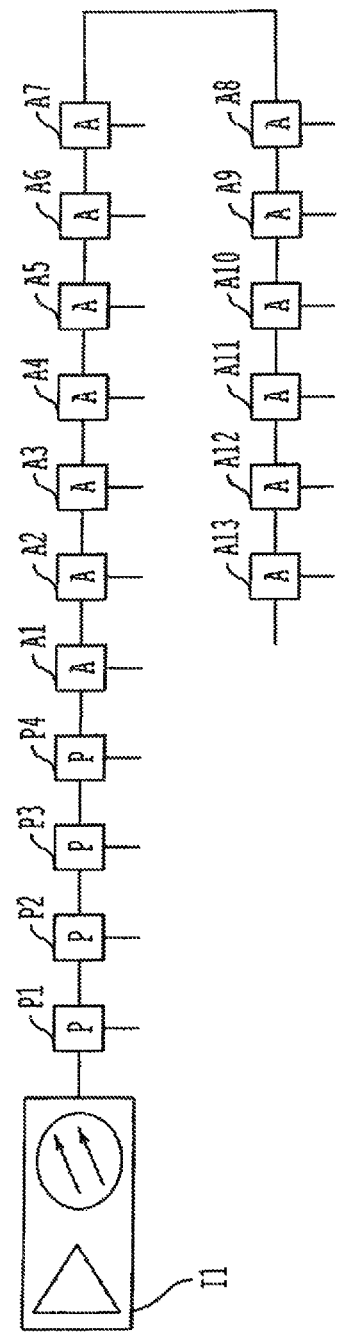
FIG. 6 is a block diagram corresponding to FIG. 4, where the idealized signal distribution system includes the active tap of FIG. 5.

FIG. 6 corresponds to FIG. 4 where the first four taps are conventional passive taps as shown in FIG. 1 and the remaining 13 taps are active taps (A1-A13) as shown in FIG. 5. (In this configuration, the first four taps are conventional passive taps to show the most cost effective system, and since the signal levels are high enough as to not require amplification. However, in other configurations, all conventional passive taps may be replaced by the active tap of FIG. 5.) In FIG. 6, each of the 13 active taps draws approximately 0.75 watts for a total power consumption of 9.75 watts. The power consumed by the cable is 10.2 milliwatts. Again, the passive taps consume no power. Thus the total power consumed with a system shown in FIG. 6 is 9.76 watts. Thus, the power consumed by the cable television signal distribution system of FIG. 6 is almost one-tenth of the power consumed by the traditional system shown in FIG. 4.

In alternative configurations, different input voltages and signal frequencies may also be used. For example, an input of 48 dBmV at 550 MHz or 39 dBmV at 55 MHz may be used with a corresponding output signal of 44 or 35 dBmV, respectively. In further configurations, the components shown in FIG. 5 can be replaced or reorganized with other circuitry so as to provide comparable low power amplification.

Figure 7:
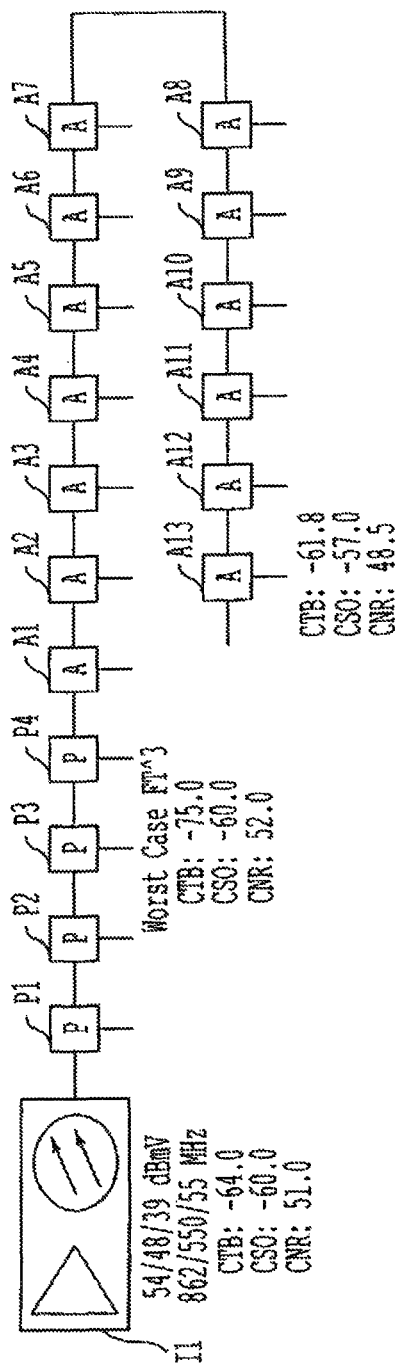
FIG. 7 is a block diagram corresponding to FIG. 2, where the idealized signal distribution system includes the active tap of FIG. 5.

FIG. 7, corresponding to FIGS. 2 and 6, illustrates the effect that active tap of FIG. 5 has upon signal quality. As in FIG. 2, source I1 outputs a signal according the following profile: 54 dBmV at 862 MHz, 48 dBmV at 550 MHz, and 39 dBmV at 55 MHz. In addition, the signal output from source I1 has a CTB of −64.0 dB; a CSO of −60.0 dB; and a CNR of 51.0 dB. The distortion generated by the active tap amplifier at an operating level of 26.5 dBmV is as follows: CTB equals −75 dB; CSO equals −60.0 dB; and CNR equals 52.0 dB. The signal quality at all subscriber output ports is the sum of the source distortions plus the distortion generated by the active tap gain stage. At the output of active tap A13 at the end of the line, CTB is improved over the conventional system of FIG. 2 with a value of −61.8 dB. CSO is effectively the same as the conventional system of FIG. 2 at a value of −57.0 dB and CNR is 0.8 dB worse, but still exceeds the industry's 48 dB requirement. (48 dB is a typically required carrier to noise ratio to prevent excess noise or snow from being seen in this display television signal.)

Figure 3:
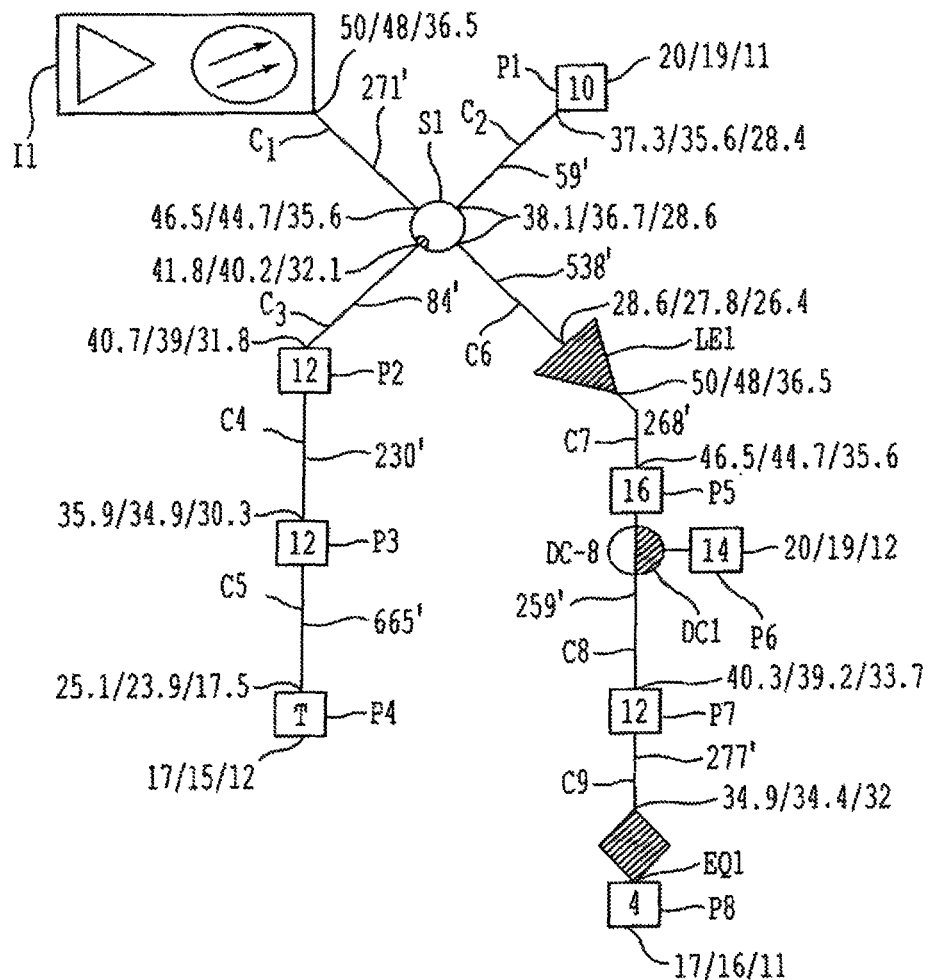
FIG. 3 is a block diagram of non-idealized signal distribution system including the conventional passive tap of FIG. 1 where the figures of merit are signal quality.
Figure 8:
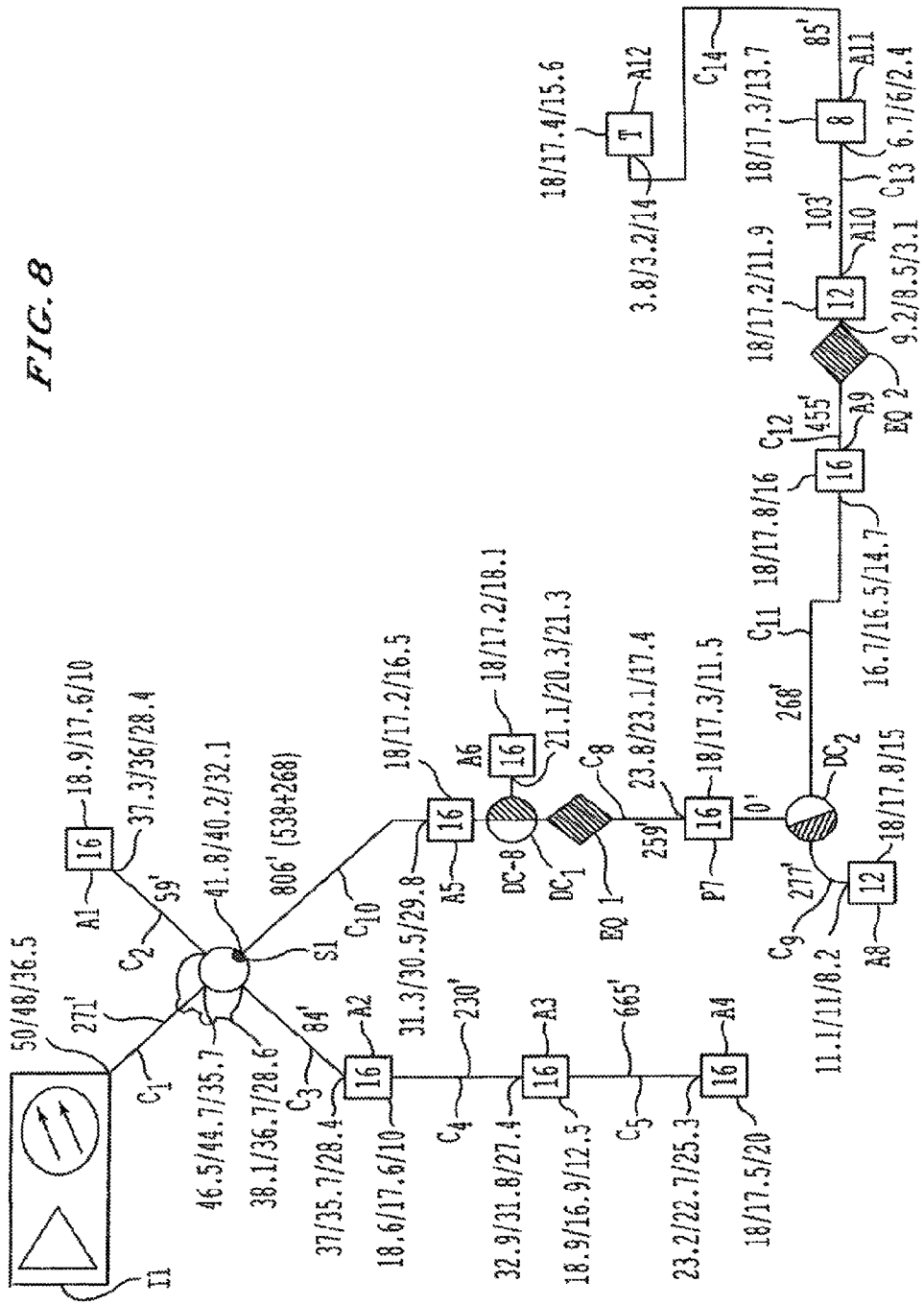
FIG. 8 is a block diagram corresponding to FIG. 3, where the non-idealized signal distribution system includes the active tap of FIG. 5.

The system of FIG. 6 includes a total of 17 taps whereas the system of FIG. 2 includes 18 taps. While in the FIGS. 6 and 7 examples it was not possible to quite reach 18 taps as in the FIG. 2 example, it was possible to extend the last tap another 29 feet. It is important to again note, however, that the systems of FIGS. 2 and 6 are gross simplifications of an actual system and are presented for comparison purposes only. In an actual system, footage between taps varies from a few feet to a thousand feet, and usually the line splits multiple times so that you can run down side streets and such. FIGS. 3 and 8 are more representative of actual cable distribution systems.

FIG. 8 corresponds to FIG. 3, where the line extender LE1 and some of the conventional passive taps have been replaced by the active taps of FIG. 5, resulting in a much larger distribution network being supplied by source I1. In general, factors for determining the number of passive and active taps that can be cascaded include: A) desired signal level at a node output; B) distance between taps; C) number of subscribers; D) density of subscribers; E) size of coaxial cable; F) number of multiple dwelling units (MDU, e.g., apartments); and G) value and efficiency of the directional coupler used (e.g., DC-8, DC-12, DC-16).

With these factors in mind, in FIG. 8 source I1 outputs a signal onto a first cable C1 of length 271 feet. This signal drops in strength due to line losses and is split by a splitter S1 onto cables C2, C3, and C10. Cable C2 ends after 59 feet at a DC16 active tap A1. Cable C3 extends 84 feet to a DC16 active tap A2 which is connected to a DC16 active tap A3 via 230 feet of cable C4. Active tap A3 is connected to a DC16 active tap A4 via cable C5. Cable C10 extends 806 feet, equivalent to cable C6 and C7 but without line extender LE1, to a DC16 active tap A5. Active tap A5 connects to a DC8 directional coupler DC1 which is connected to a DC16 active tap A6 and to in-line equalizer EQ1. Equalizer EQ1 connects to cable C8, which extends 259 feet to a conventional DC12 passive tap P7. Passive tap P7 connects to a DC-8 directional coupler DC2 which connects to cable C9. Cable C9 extends 277 feet to a DC12 active tap A8. Thus, in FIG. 8, passive taps P1-P6 and P8 have been replaced with active taps, and LE1 is no longer required.

Furthermore, because the active taps can run on much lower input levels due to the internal amplification, additional cable runs and consumer drops are possible. Also connected to DC2 is a DC16 active tap A9 via 268 feet of cable C11. Active tap A9 is connected to equalizer EQ2 via 455 feet of cable C12. EQ2 connects to a DC12 active tap A10 which connects to a DC8 active tap A11 via 103 feet of cable C13. Active tap A11 connects to a terminating active tap A12 via 85 feet of cable C14. Thus, the configuration of FIG. 8 allows for 16 additional cable drops (via active taps A9-12) over 911 feet of cable (cables C11-C14).

Input and output signal levels (in terms of dB mV) at 862 MHz/750 MHz/55 MHz, respectively, are shown in Table T2.

TABLE T2

| Device | Input Signal Level | Output Signal Level |
|---|---|---|
| I1 | --/--/-- | 50/48/36.5 |
| C1 | 50/48/36.5 | 46.5/44.7/35.6 |
| S1 | 46.5/44.7/35.6 | 41.8/40.2/32.1 |
|  |  | 38.1/36.7/28.6 |
| C2 | 38.1/36.7/28.6 | 37.3/35.6/28.4 |
| A1 | 37.3/35.6/28.4 | 18.9/17.6/10.0 |
| C3 | 38.1/36.7/28.6 | 37/35.7/28.4 |
| A2 | 37/35.7/28.4 | 18.6/17.6/10.0 |
| C4 | 35.9/34.6/28.1 | 32.9/31.8/27.4 |
| A3 | 32.9/31.8/27.4 | 18.0/16.9/12.5 |
| C5 | 31.8/30.7/27.1 | 23.2/22.7/25.3 |
| A4 | 23.2/22.7/25.3 | 18.0/17.5/20.0 |
| C10 | 41.8/40.2/32.1 | 31.3/30.5/29.8 |
| A5 | 31.3/30.5/29.8 | 18.0/17.2/16.5 |
| DC1 | 30.2/29.4/29.5 | 28.4/27.6/28.8 |
|  |  | 22.2/21.4/21.5 |
| A6 | 22.2/21.4/21.5 | 18.0/17.2/18.1 |
| EQ1 | 28.4/27.6/28.8 | 28.0/26.2/19.0 |
| C8 | 28.0/26.2/19.0 | 23.8/23.1/17.4 |
| P7 | 23.8/23.1/17.4 | 18.0/17.3/11.5 |
| DC2 | 22.7/22.0/17.1 | 20.9/20.2/16.4 |
|  |  | 14.7/14.0/9.1 |
| C9 | 14.7/14.0/9.1 | 11.1/11/8.2 |
| A8 | 11.1/11/8.2 | 18.0/17.8/15.0 |
| C11 | 20.9/20.2/16.4 | 16.7/16.5/14.7 |
| A9 | 16.7/16.5/14.7 | 18.0/17.8/16.0 |
| C12 | 15.6/15.4/14.4 | 9.7/9.9/13.1 |
| EQ2 | 9.7/9.9/13.1 | 9.2/8.5/3.1 |
| A10 | 9.2/8.5/3.1 | 18.0/17.2/11.9 |
| C13 | 8.0/7.3/2.7 | 6.7/6.0/2.4 |
| A11 | 6.7/6.0/2.4 | 18.0/17.3/13.7 |
| C14 | 4.9/4.2/2.7 | 3.8/3.2/2.5 |
| A12 | 3.8/3.2/2.5 | 18.0/17.4/15.6 |

One figure of merit relative to the value of the present invention's active tap is the installation cost/number of tap outputs. The costs of all devices used in the conventionally equipped distribution network were compared with the costs of all devices used when passive taps are replaced with active taps of FIG. 5. First, significant cost savings were accrued by obviating the need for expensive line extenders. Furthermore, the cost of the network was amortizable over a larger number of customers (e.g., 12 taps with 4 output ports in FIG. 8 vs. 8 taps with 4 output ports in FIG. 3), thus providing another figure of merit relative to the economic benefit of the device of FIG. 5.

In comparing a large configuration based on distribution networks of FIGS. 3 and 8, the distribution system with active taps consumed 48% less power than the distribution system with all passive taps. Thus, based on $1/watt/year, the cost to operate the modified system was estimated to be $280/year less than the conventionally equipped distribution system. In a second computer model with a more densely populated configuration (including a node, eight trunk amplifiers, 73 taps, and numerous multiple dwelling units (MDUs), where each MDU required a line extender input from the main line, not from a tap). In this modeled densely populated configurations, use of the active tap of FIG. 5 resulted in all 8 trunks being eliminated with all MDUs being reached at the required input levels. In this second example, the power savings were estimated to be $516 per year. Not included is the initial cost savings due to requiring 50% fewer power supplies and their maintenance.

Another important feature of the present invention is that the active part of the present invention is not in series with the rest of the devices downstream. Thus a failure in one unit will result in a maximum of only 4 subscribers losing service. In the case of a bridger or line extender, however, all subscribers downstream will lose service if the bridger or line extender fails or during normal maintenance. Thus, a network using the active tap of FIG. 5 will be characterized by reduced subscriber outage minutes.

Figure 9:
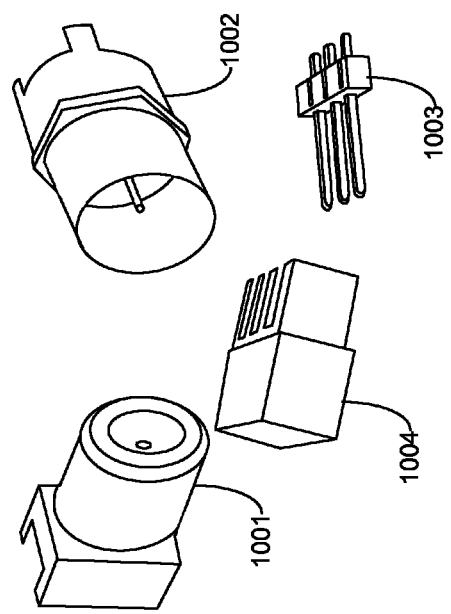
FIG. 9 is a photograph of connectors used with the device of FIG. 5.

To optimize the system construction cost and provide signal security, the active tap body may be installed with a blanked cover plate containing no active components. At a later date, when it is economically or technically desirable to provide active taps in the system the blanked cover plate may be replaced with a new cover plate with the components corresponding to the circuit of FIG. 5 embedded therein. FIG. 9 is an illustration of components that would be used to make the connection in a cover plate that includes embedded active components. Connectors 1001 and 1002 are for the RF connection from the faceplate to the housing. These two components will match up and slide together when the faceplate is inserted into the housing. Connectors 1003 and 1004 are configured to provide the AC power used with the active tap. These connectors may actually be two connectors (power and ground). Connectors 1003 and 1004 will be attached to wires that supply power and ground. Connectors 1003 and 1004 will then be connected together before the cover plate is connected to the housing. The housing can be environmentally secure, can include RFI protection, can be configured for indoor mounting or outdoor strand mounting, and can be configured to be cable or AC line powered.

Another benefit of using the active tap of FIG. 5 concerns group delay. In conventional systems there are often a plurality of amplifiers cascaded between the fiber node and the customer, where each amplifier typically includes two diplex filters. Each of these diplex filters is characterized by a group delay which causes the signal to be delayed as it passes through the filter. The amount of delay varies with the frequency of the signal. Because of this frequency-dependent delay, some conventional systems are forced to not use the higher end of the frequency band (5-42 MHz) in the reverse direction. This reduces the available return path bandwidth, which limits the number of customers that can be supplied with two-way devices such as cable modems and set-top boxes. Because the active tap of FIG. 5 eliminates most amplifiers and the end-subscriber only sees the active tap's diplex filter and complimentary filter, group delay in the reverse path is greatly reduced, thereby preserving reverse-path bandwidth and enabling a broader array of customer services.

Another benefit of using the active tap of FIG. 5 concerns overall bandwidth. In conventional systems amplifiers typically provide up to 862 MHz of bandwidth. However, new customer services such as high definition television (HDTV) may require more system bandwidth. Because the device of FIG. 5 employs monolithic microwave integrated circuit (MMIC) technology, the device can easily support bandwidth expansion beyond 1 GHz.

In the preceding disclosure, reference has been made to cable television signal distribution. The device of FIG. 5 may also be adapted for use in cable audio signal distribution networks as well as cable-based computer signal distribution networks. In addition, the device of FIG. 5 may be adapted for use in fiber-optic television, audio, and computer signal distribution networks.

The present invention has the additional features of

Significant reduction in the number of system power supplies required, and the reduction in cost of maintaining battery and motor generators due to the decrease in power consumption.

A device failure will cause an outage to only a limited number (typically four) subscribers. For a four subscriber configuration, an outage would result in four outage minutes per minute, whereas a conventional system having a failed line extender would result in widescale outages (e.g., a failure of LE1 in FIG. 2 would result in 52 outage minutes per minute).

Maintenance on a device will impact only a limited number of subscribers (e.g., four subscribers vs. 52 for LE1 in the system of FIG. 2 described above).

Increased reverse bandwidth usability. Digital modulated signals are sensitive to group delay caused by diplex filters used to isolate forward signals from reverse signals. The more filters, the greater the band edge group delay. A conventional system may have seven isolation filters between the subscriber at the end of the cascade and the return amplifier. The presented network is designed to have two high isolation filters and one complimentary filter which has very little group delay.

Advances in medium power MMIC devices make extended system bandwidth with digital modulated channels to 1 GHz or higher possible.

Numerous modifications and variations of the present invention are possible in light of the above teachings. It is therefore to be understood that within the scope of the appended claims, the invention may be practiced otherwise than specifically described herein.

The invention claimed is:

1. A method for actively amplifying a signal, comprising:
passing an RF signal from an input port to an output port;
tapping said input RF signal to provide a tapped signal;
amplifying said tapped signal with an active tap configured to consume no more than 0.5 Watts while providing a noise figure of no more than 3 dB and a bandwidth of 20 MHz-1.5 GHz to provide an amplified tap signal; and
passing said amplified tap signal to a tap output.

2. The method of claim 1, wherein said step of amplifying with an active tap comprises:
amplifying with discrete components including silicon or GaAs based transistors.

3. The method of claim 1, wherein said step of amplifying with an active tap comprises:
amplifying with a MMIC component.

4. The method of claim 3, wherein said step of amplifying with a MMIC component comprises:
amplifying with discrete components including silicon or GaAs based transistors.

5. The method of claim 1, wherein said step of passing said amplified tap signal comprises:
splitting said amplified tap signal.

6. The method of claim 1, further comprising:
passing a feedback signal from said tap output to said input port.

7. A method for distributing an RF signal via cable, comprising:
passing an RF signal through a first active tap; and
passing said RF signal through a second active tap, said second active tap either in series or in parallel with said first active tap, wherein each of said steps of passing comprise:
tapping an input RF signal to provide a tapped signal;
amplifying said tapped signal with an active component consuming no more than 0.5 Watts and providing a noise figure of no more than 3 dB and a bandwidth of 20 MHz-1.5 GHz to provide an amplified tap signal; and
outputting said amplified tap signal to a tap output.

8. The method of claim 7, wherein said step of amplifying comprises:
amplifying with discrete components including silicon or GaAs based transistors.

9. The method of claim 7, wherein said step of amplifying comprises:
amplifying with a MMIC component.

10. The active signal tap device of claim 9, wherein said step of amplifying with a MMIC component comprises:
amplifying with discrete components including silicon or GaAs based transistors.

11. The method of claim 7, wherein said step of outputting said amplified tap signal comprises:
splitting said amplified tap signal.

12. The method of claim 7, wherein at least one of said steps of passing comprise:
passing a feedback signal from said tap output to said input port.

13. The method of claim 7, wherein said step of amplifying said tapped signal with an active tap comprises:
amplifying said tapped signal with an active tap housed within an environmentally secure housing.

14. The method of claim 7, wherein said step of amplifying said tapped signal with an active tap comprises:
amplifying said tapped signal with an active tap housed in a housing provided with RFI protection.

15. The method of claim 7, wherein said step of amplifying said tapped signal with an active tap comprises one of:
amplifying said tapped signal with an active tap housed in a housing configured to be mounted indoors; and
amplifying said tapped signal with an active tap housed in a housing configured to be strand mounted outdoors.

16. The method of claim 7, wherein said step of amplifying said tapped signal with an active tap comprises one of:
amplifying said tapped signal with an active tap which can be cable powered; and
amplifying said tapped signal with an active tap which can be AC line powered.

17. A system for actively amplifying a signal, comprising:
means for passing an RF signal from an input port to an output port;
means for tapping said input RF signal to provide a tapped signal;
means for amplifying said tapped signal with an active tap configured to consume no more than 0.5 Watts while providing a noise figure of no more than 3 dB and a bandwidth of 20 MHz-1.5 GHz to provide an amplified tap signal; and means for passing said amplified tap signal to a tap output.

18. The system of claim 17, wherein said means for amplifying comprises:

means for amplifying with discrete components including silicon or GaAs based transistors.

19. The system of claim 17, wherein said step of amplifying comprises:

means for amplifying with a MMIC component.

20. The system of claim 19 wherein said means for amplifying with a MMIC component comprises:

means for discrete components including silicon or GaAs based transistors.

21. The system of claim 17, wherein said step of passing said amplified tap signal comprises:

means for splitting said amplified tap signal.

22. The system of claim 17, further comprising:

means for passing a feedback signal from said tap output to said input port.

23. The system of claim 17, wherein said means for amplifying said tapped signal with an active tap comprises:

means for amplifying said tapped signal with an active tap housed within an environmentally secure housing.

24. The system of claim 17, wherein said means for amplifying said tapped signal with an active tap comprises:

means for amplifying said tapped signal with an active tap housed in a housing provided with RFI protection.

25. The system of claim 17, wherein said means for amplifying said tapped signal with an active tap comprises one of:

means for amplifying said tapped signal with an active tap housed in a housing configured to be mounted indoors; and means for amplifying said tapped signal with an active tap housed in a housing configured to be stand mounted outdoors.

26. The system of claim 17, wherein said means for amplifying said tapped signal with an active tap comprises one of:

means for amplifying said tapped signal with an active tap which can be cable powered; and means for amplifying said tapped signal with an active tap which can be AC line powered.

27. A system for distributing an RF signal via cable, comprising:

means for passing an RF signal through a first active tap; and means for passing said RF signal through a second active tap, said second active tap either in series or in parallel with said first active tap, wherein each of said means for passing comprise:

means for tapping an input RF signal to provide a tapped signal;

means for amplifying said tapped signal while consuming no more than 0.5 Watts and providing a noise figure of no more than 3 dB and a bandwidth of 20 MHz-1.5 GHz to provide an amplified tap signal; and means for outputting said amplified tap signal to a tap output.

28. The system of claim 27, wherein said means for amplifying comprises:

means for amplifying with discrete components including silicon or GaAs based transistors.

29. The system of claim 27, wherein said step of amplifying comprises:

means for amplifying with a MMIC component.

30. The system of claim 29, wherein said means for amplifying with a MMIC component comprises:

means for amplifying with discrete components including silicon or GaAs based transistors.

31. The system of claim 27, wherein said step of outputting said amplified tap signal comprises:

means for splitting said amplified tap signal.

32. The system of claim 27, wherein at least one of said steps of passing comprise:

means for passing a feedback signal from said tap output to said input port.

33. The system of claim 27, wherein said means for amplifying said tapped signal with an active tap comprises:

means for amplifying said tapped signal with an active tap housed within an environmentally secure housing.

34. The system of claim 27, wherein said means for amplifying said tapped signal with an active tap comprises:

means for amplifying said tapped signal with an active tap housed in a housing provided with RFI protection.

35. The system of claim 27, wherein said means for amplifying said tapped signal with an active tap comprises one of:

means for amplifying said tapped signal with an active tap housed in a housing configured to be mounted indoors; and means for amplifying said tapped signal with an active tap housed in a housing configured to be strand mounted outdoors.

36. The system of claim 27, wherein said means for amplifying said tapped signal with an active tap comprises one of:

means for amplifying said tapped signal with an active tap which can be cable powered; and means for amplifying said tapped signal with an active tap which can be AC line powered.

* * * * *